United States Patent
Wu et al.

(10) Patent No.: US 11,204,376 B2
(45) Date of Patent: Dec. 21, 2021

(54) DPS-BASED ELECTRICAL ENERGY METERING DEVICE

(71) Applicant: Hangzhou Vango Technologies, Inc., Zhejiang (CN)

(72) Inventors: Boqiang Wu, Zhejiang (CN); Nick Nianxiong Tan, Zhejiang (CN)

(73) Assignee: HANGZHOU VANGO TECHNOLOGIES, INC., Zhejiang (CN)

( * ) Notice: Subject to any disclaimer, the term of this patent is extended or adjusted under 35 U.S.C. 154(b) by 127 days.

(21) Appl. No.: 16/843,863

(22) Filed: Apr. 8, 2020

(65) Prior Publication Data
US 2021/0318367 A1  Oct. 14, 2021

(51) Int. Cl.
*G01R 22/00* (2006.01)
*G01R 22/10* (2006.01)
*G01R 35/04* (2006.01)

(52) U.S. Cl.
CPC ............. *G01R 22/10* (2013.01); *G01R 35/04* (2013.01)

(58) Field of Classification Search
CPC ................................ G01R 22/10; G01R 35/04
USPC ........................................................ 702/62
See application file for complete search history.

(56) References Cited

U.S. PATENT DOCUMENTS 9,513,319 B1 * 12/2016 Fosler ................. G05B 19/056
11,036,508 B2 * 6/2021 Wang ..................... G06Q 50/06

OTHER PUBLICATIONS

Boqiang Wu, An Energy Metering Chip With a Flexible Computing Engine, Apr. 10, 2019, Digital Object Identifier 10.1109/ACCESS. 2019.2909435, vol. 7, 2019.

* cited by examiner

*Primary Examiner* — John H Le
(74) *Attorney, Agent, or Firm* — Yue (Robert) Xu; Apex Attorneys at Law, LLP (57) ABSTRACT

A DSP-based electrical energy metering device is provided. After determining a current application mode, a DSP controller compares an execution rate of each computing task with a corresponding preset comparison value, and outputs a first condition value to a condition general register based on a comparison result, so as to control an execution rate of each computing task in the DSP controller. A jump condition controller outputs a second condition value corresponding to the current application mode to the condition general register based on a change in the execution rate of each computing task compared with an execution rate of the computing task in a previous application mode, so that all computing tasks are executed. An adaptive word length controller adjusts an effective bit width of the electrical signal read by a data general register from a data memory at execution rates of different computing tasks.

11 Claims, 2 Drawing Sheets

DPS-BASED ELECTRICAL ENERGY METERING DEVICE

FIELD

The present disclosure relates to the technical field of signal metering, and in particular to a DSP-based electrical energy metering device.

BACKGROUND

With the wide deployment of electrical power Internet of Things, increasing sensing nodes are required to access the electrical power Internet of Things. These sensing nodes are configured to measure electrical signals, such as a voltage signal, and a current signal. Then an electrical energy metering device computes the electrical energy based on the electrical signals. There are two implementations for the electrical energy metering device in the conventional technology. In one implementation, the electrical energy metering device is implemented by software, and in the other implementation, the electrical energy metering device is implemented by an application specific integrated circuit (ASIC). Although bringing sufficient flexibility, the software implementation consumes more power than the ASIC implementation.

There are currently two implementations of the ASIC, namely, an implementation of a metering system on chip (SoC) and an implementation of MCU external metering chip (which is provided with a dedicated digital signal processor (DSP)). The metering SoC is provided with a DSP, an MCU, and a high precision ADC. However, both the metering SoC and the MCU external metering chip are provided with the dedicated DSP These dedicated DSPs provide only fixed functions, that is, only a fixed metering bandwidth and fixed response time, and are only applied in scenarios where the metering bandwidth and the response time are initially specified, and thus cannot satisfy requirements of different application scenarios.

SUMMARY

An object of the present disclosure is to provide a DSP-based electrical energy metering device, so that a metering bandwidth of the device, response time and stabilization time of a digital filter implemented by the device are configurable while ensuring computing accuracy. The device is applicable to various application scenarios and has great flexibility.

In order to solve the above technical problems, a DSP-based electrical energy metering device is provided according to the present disclosure. The electrical energy metering device includes a DSP controller, an arithmetic logic unit, an instruction decoder, a data general register, a program memory configured to store a computing program, a data memory configured to store an electrical signal, and a condition general register configured to store a program jump condition value. The DSP-based electrical energy metering device further includes a system control register, a rate controller, a jump condition controller, and an adaptive word length controller.

The system control register is configured to output a rate control signal, a jump condition control signal and a bit width adjustment control signal corresponding to a current application mode.

The rate controller is configured to determine an execution rate corresponding to each computing task based on the rate control signal.

The jump condition controller is configured to output, in response to the jump condition control signal, a second condition value corresponding to the current application mode to the condition general register based on a change in the execution rate of each computing task compared with an execution rate of the computing task in a previous application mode, to execute all computing tasks.

The adaptive word length controller is configured to adjust an effective bit width of an electrical signal read by the data general register from the data memory based on the bit width adjustment control signal.

The DSP controller is configured to compare the execution rate with a corresponding preset comparison value, output a first condition value to the condition general register based on a comparison result, and control the program memory, the instruction decoder, and the arithmetic logic unit based on the first condition value and the second condition value to compute the electrical signal subjected to the effective bit width adjustment, to obtain electrical energy.

In an embodiment, the current application mode is a high precision mode or a fast response mode.

In an embodiment, the bit width adjustment control signal includes a high address enable signal, a low address enable signal, and an adjustment control signal. The adaptive word length controller includes a high address register, a low address register, an effective bit width adjustment module and a first data selector. The high address register is configured to output the electrical signal read by the data general register from the data memory in a case that the high address enable signal is valid. The low address register is configured to output the electrical signal read by the data general register from the data memory in a case that the low address enable signal is valid. The effective bit width adjustment module is configured to adjust the effective bit width of the electrical signal based on the adjustment control signal. The first data selector is configured to output the electrical signal subjected to the effective bit width adjustment if the high address enable signal or the low address enable signal is valid; otherwise, output the electrical signal read by the data general register from the data memory.

In an embodiment, the high address register is a 32-bit high address register, and the low address register is a 32-bit low address register.

In an embodiment, the data general register includes a 64-bit first data general register and a 64-bit second data general register.

In an embodiment, the DSP-based electrical energy metering device further includes an address decoder arranged between a memory manager and the instruction decoder. The address decoder is configured to: classify an address outputted by the instruction decoder; if the address is an actual data address, directly output the actual address to the data memory; if the address is a virtual data address, map the virtual address to a corresponding actual data address based on a preset virtual actual address mapping relationship, and output the mapped actual data address to the data memory. In a case that computing algorithms in different computing steps in one computing task are identical to each other, only one computing algorithm and one virtual data address in the different computing steps are stored in the program memory, and the virtual address and an actual data address of a to-be-processed electrical signal in the data memory in the different computing steps satisfy the preset virtual actual address mapping relationship.

In an embodiment, the address decoder includes an address classifier, a virtual address decoder, and a second data selector. The address classifier is configured to: classify the address outputted by the instruction decoder; if the address is an actual data address, directly output the actual address to the data memory via the second data selector; and if the address is a virtual data address, output the virtual address to the virtual address decoder. The virtual address decoder is configured to map the virtual address to the corresponding actual data address based on the preset virtual actual address mapping relationship, and output the mapped actual data address to the data memory via the second data selector.

A DSP-based electrical energy metering device is provided according to the present disclosure. Different from the fixed execution rate of each computing task and the fixed condition value in the condition general register in the conventional technology, in this device according to the present disclosure, after determining the current application mode, the rate controller outputs the execution rate of each computing task to the DSP controller, so that the DSP controller compares the execution rate with a corresponding preset comparison value, and outputs a first condition value to the condition general register based on the comparison result, so as to control the execution rate of each computing task in the DSP controller. The jump condition controller outputs a second condition value corresponding to the current application mode to the condition general register based on a change in the execution rate of each computing task compared with an execution rate of the computing task in a previous application mode, to control an execution flow of a program, so that all computing tasks are executed. In addition, the adaptive word length controller adjusts the effective bit width of the electrical signal read by the data general register from the data memory at execution rates of different computing tasks. It can be seen that a metering bandwidth of the device, response time and stabilization time of a digital filter implemented by the device are configurable while ensuring computing accuracy. The device is applicable to various application scenarios and has great flexibility.

BRIEF DESCRIPTION OF THE DRAWINGS

In order to more clearly illustrate technical solutions in embodiments of the present disclosure, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION OF EMBODIMENTS

A core of the present disclosure is to provide a DSP-based electrical energy metering device, so that a metering bandwidth of the device, response time and stabilization time of a digital filter implemented by the device are configurable while ensuring computing accuracy. The device is applicable to various application scenarios and has great flexibility.

In order to make objects, technical solutions, and advantages of the embodiments of the present disclosure clearer, the technical solutions in the embodiments of the present disclosure are described clearly and completely in conjunction with the drawings in the embodiments of the present disclosure hereinafter. It is apparent that the described embodiments are only some embodiments of the present disclosure, rather than all embodiments. All other embodiments obtained by those skilled in the art based on the embodiments of the present disclosure without any creative work fall within the protection scope of the present disclosure.

Figure 1:
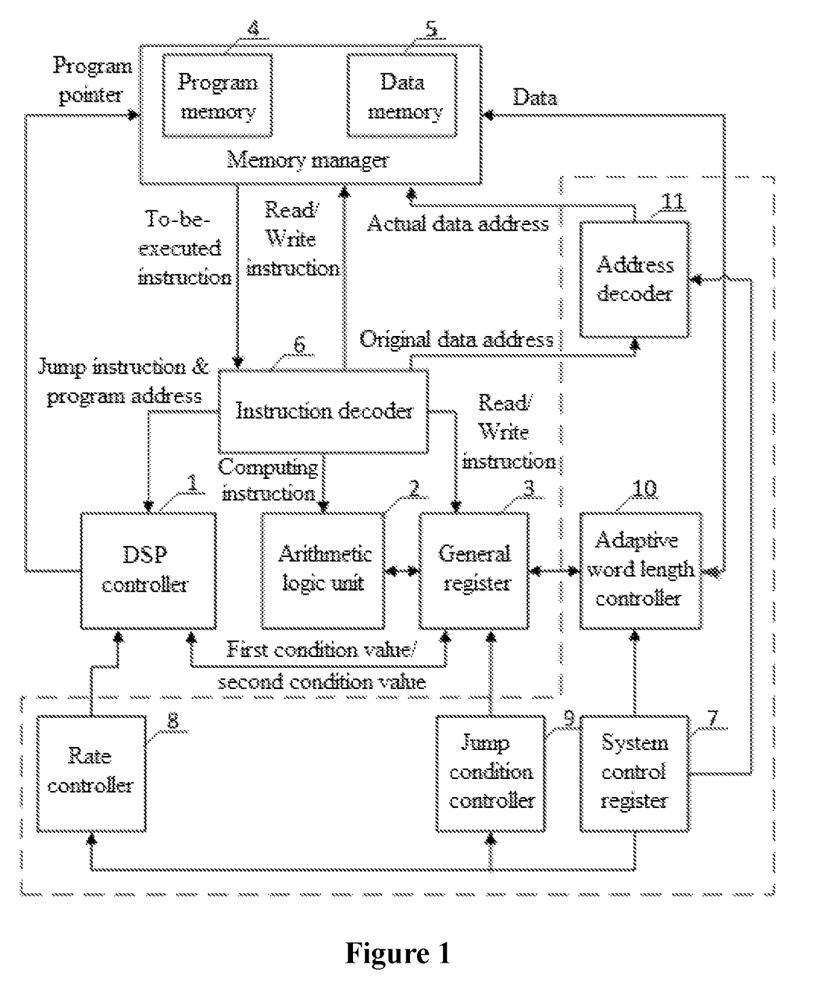
FIG. 1 is a schematic structural diagram of a DSP-based electrical energy metering device according to the present disclosure.

Reference is made to FIG. 1, which is a schematic structural diagram of a DSP-based electrical energy metering device according to the present disclosure.

The device includes a DSP controller 1, an arithmetic logic unit 2, an instruction decoder 6, a data general register (not shown in FIG. 1), a program memory 4 configured to store a computing program, a data memory 5 configured to store an electrical signal, and a condition general register (not shown in FIG. 1) configured to store a program jump condition value. The device further includes a system control register 7, a rate controller 8, a jump condition controller 9, and an adaptive word length controller 10.

The system control register 7 is configured to output a rate control signal, a jump condition control signal and a bit width adjustment control signal corresponding to a current application mode.

The rate controller 8 is configured to determine an execution rate corresponding to each computing task based on the rate control signal.

The jump condition controller 9 is configured to output, in response to the jump condition control signal, a second condition value corresponding to the current application mode to the condition general register based on a change in the execution rate of each computing task compared with an execution rate of the computing task in a previous application mode, to execute all computing tasks.

The adaptive word length controller 10 is configured to adjust an effective bit width of an electrical signal read by the data general register from the data memory 5 based on the bit width adjustment control signal. The effective bit width of the electrical signal is negatively correlated to the execution rate of the computing task in the current application mode.

The DSP controller 1 is configured to compare the execution rate with a corresponding preset comparison value, output a first condition value to the condition general register based on a comparison result, and control the program memory 4, the instruction decoder 6, and the arithmetic logic unit 2 based on the first condition value and the second condition value to compute the electrical signal subjected to the effective bit width adjustment, to obtain electrical energy.

First of all, it should be noted that a general register 3 shown in FIG. 1 includes a condition general register and a data general register. In a preferred embodiment, the data general register includes a 64-bit first data general register and a 64-bit second data general register.

Power consumption of the DSP-based electrical energy metering device is reduced while execution efficiency is ensured. In the present disclosure, the data general register includes a first data general register and a second data general register, both with a width of 64 bits. The first data general register and the second data general register are configured to compute and temporarily store a computing result or an accessing result of the data memory 5. In a case that input data has a length of 32 bits and a computing rate changes, a bit width of the 32-bit computing data cannot satisfy computing requirements of other filters. Therefore, the first data general register and the second data general register are designed to have a bit width of 64 bits. For data with a bit width less than 32 bits, a 32-bit general register 3 is configured to store an intermediate computing result or participate in the computing. That is, high 32 bits or low 32 bits of the first data general register or the second data general register is generally used. When computing the data with a bit width greater than 32 bits, the 64-bit first data general register or the 64-bit second data general register is configured to store the intermediate computing result or participate in the computing.

After collecting an electrical signal (such as a voltage signal, and a current signal), a sensing node outputs the electrical signal to the ADC. After sampling the electrical signal, the ADC outputs a 1-bit code stream. After being expanded by a 1-bit sign bit, the 1-bit code stream is sent to an ADC data register. Then, the electrical signal in the ADC data register is sent to a Cascaded Integrator-Comb (CIC) filter implemented by components in the DSP-based electrical energy metering device in cooperation. Data outputted by the CIC filter has a width of 29 bits. During the implementation of the DSP-based electrical energy metering device, data is computed by using fixed-point number operation. A data width of a fixed-point number is 32 bits, where first two bits are sign bits. Therefore, the ADC data register is defined as a 32-bit register, and the ADC data register is read-only. In the program, the value of this register is read only before performing computing at each sampling point, and then subsequent computing can be started.

The condition general register has a bit width of 1 bit, and is configured to store the program jump condition value. When a condition jump occurs, a condition value in the general register 3 is judged to determine whether to jump.

Basic functions of components in the electrical energy metering device are described below.

In the electrical energy metering device, the program executed by the DSP is stored in the program memory 4. The intermediate computing data and result data are stored in the data memory 5. In each clock cycle, the program memory 4 generates a to-be-executed instruction based on a program pointer outputted by the DSP controller 1.

In a case that the instruction decoder 6 outputs a read/write instruction, the instruction decoder 6 outputs the decoded read/write instruction to the data memory 5 and the data general register. The instruction decoder 6 outputs the decoded data address to the data memory 5. If a current instruction is a read instruction, data outputted from the data memory 5 is temporarily stored in the data general register. If the current instruction is a write instruction, the data general register outputs the data, and the data is stored in the data memory 5 according to the data address.

In a case that the instruction decoder 6 outputs a computing instruction, the computing instruction is sent to the arithmetic logic unit 2 to perform computing. Data required for the computing comes from the data general register. A computing result is temporarily stored in the data general register.

In a case that the instruction decoder 6 outputs a jump instruction, the jump instruction and a program address are outputted to the DSP controller 1. In a case of a condition jump, the DSP controller 1 changes the program pointer based on a condition comparison result outputted by the condition general register. In a case of an absolute jump, the program pointer is directly changed to a program address received by the module.

The electrical energy metering device according to the present disclosure includes a system control register 7, a rate controller 8, a jump condition controller 9, and an adaptive word length controller 10.

It should be noted that the electrical energy metering device in the conventional technology cannot configure the metering bandwidth, and the response time and the stabilization time of the digital filter, since the execution rate of each computing task in the DSP controller 1 in the conventional technology is fixed. Accordingly, the condition value of each computing task in the condition general register is also fixed, and corresponds to only one application mode. In this application mode, a program execution direction and a program execution speed determined by the DSP controller 1 based on the condition value are also fixed, resulting in that the metering bandwidth, and the response time and the stabilization time of the digital filter are also fixed.

In order to be applicable to more application scenarios, in the present disclosure, various application modes are established in advance based on user requirements. The application mode herein may be a high precision mode (accordingly, a response speed in the high precision mode may be slow) or a fast response mode (accordingly, accuracy in the fast response mode may be low). In practical applications, the high accuracy mode may be divided into modes with different accuracy levels based on actual needs, and the fast response mode may be divided into modes with different response speed levels based on actual needs.

In different application modes, execution rates of computing tasks in the DSP controller 1 are different, and condition values in the condition general register are also different. Since the execution rates of computing tasks are different, in order to prevent data overflow during a computing process and thus resulting in an error in electrical energy metering, effective data bit widths of data computed by the arithmetic logic unit 2 are different. The effective bit width of the electrical signal is negatively correlated to the execution rate of the computing task in a current application mode. Based on this, a relationship between the application modes and the execution rates, the condition values, and the effective data bit widths of the data of computing tasks is established in advance in the present disclosure, so that the execution rates, the condition values, and the effective data bit widths of the data of computing tasks are adjusted based on different application modes in a subsequent execution process.

The response time and the stabilization time of the digital filter (which may be but is not limited to a CIC filter) implemented by the electrical energy metering device may be changed by changing a down-sampling rate of the digital filter. The down-sampling rate may be changed by changing the execution rate of each computing task in the DSP controller 1. When an execution rate of a computing task is changed, a computing period of the computing task also changes. A ratio of the computing period of the computing task to a total computing period changes, which may affect an execution flow of other computing tasks in the total computing period. For example, an execution rate of a computing task is reduced, resulting in an increase in a computing period of the computing task. If execution rates of other computing tasks are unchanged, the other computing tasks cannot be executed in the total computing period.

In order to ensure that all computing tasks are executed, the jump condition controller 9 outputs a second condition value corresponding to the current application mode to the condition general register based on a change in the execution rate of each computing task compared with an execution rate of the computing task in a previous application mode, so that all computing tasks are executed, thereby controlling the execution flow of the program (which is described below).

In the present disclosure, the rate controller 8 and the jump condition controller 9 are configured to control the execution direction of the DSP controller 1 and the execution rate of the computing task. For the condition jump instruction of the DSP controller 1, the jump condition in the electrical energy metering device may be generated in two manners. In one manner, the DSP controller 1 changes a value of the condition general register, that is, the first condition value, based on the execution rate of each computing task and the preset comparison value corresponding to the computing task that are sent by the rate controller 8, to perform a judgment. In the other manner, the jump condition controller 9 directly outputs the second condition value to the condition general register, and then performs judgment. Therefore, the rate controller 8 can control the execution rate of each computing task in the DSP program, and the jump condition controller 9 can control the execution flow of the program.

The rate controller 8 is configured to control the execution rate of each computing task in the DSP program, so that the DSP controller 1 configures the first condition value of the condition general register based on the execution rate of each computing task without changing the program, thereby achieving a technical effect that the metering bandwidth, and the response time and the stabilization time of the digital filter are configurable. It should be noted that when writing the DSP program, the computing tasks are classified based on a computing frequency. Different types of computing tasks are separated by a control function. In response to a condition comparison instruction in the control function, a corresponding computing task can be selectively jumped to, thereby achieving independent control for the computing frequencies of different computing tasks. The rate controller 8 automatically generates a program execution rate in the condition comparison instruction based on a rate control signal of the system control register 7. The DSP controller 1 compares the program execution rate with a preset comparison value in the condition comparison instruction. If the program execution rate is equal to the preset comparison value, 1 is assigned to the condition general register. Otherwise, 0 is assigned to the condition general register.

For example, it is assumed that in the current application mode, there are a computing task 1 and computing tasks 2, 3, 4, 5. An execution rate of each of the last four tasks is equal to ¼ of that of the task 1. In this case, the total computing period is equal to a sum of a computing period of the computing task 1, a computing period of the computing task 2, a computing period of the computing task 3, a computing period of the computing task 4, and a computing period of the computing task 5. The tasks may be assigned by the following program.

Task1:
  JMPA CTRL_TASK1 (Jump to a control task 1)
  NOP
CTRL_TASK1:
  CND 0 RATE1 (Compare a value of RATE1 with 0, and set a first condition value to 1 if the value of RATE1 is equal to 0)
  JMPC TASK2 (Jump to a task 2 for execution if the jump condition is 1)
  CND 1 RATE1 (Compare the value of RATE1 with 1, and set the first condition value to 1 if the value of RATE1 is equal to 1)
  JMPC TASK3 (Jump to a task 3 for execution if the jump condition is 1)
  CND 2 RATE1 (Compare the value of RATE1 with 2, and set the first condition value to 1 if the value of RATE1 is equal to 2)
  JMPC TASK4 (Jump to a task 4 for execution if the jump condition is 1)
  CND 3 RATE1 (Compare the value of RATE1 with 3, and set the first condition value to 1 if the value of RATE1 is equal to 3)
  JMPC TASK5 (Jump to a task 5 for execution if the jump condition is 1)
  NOP
  JMPA END
  NOP The execution rate of each computing task may be assigned to the RATE1, and 0, 1, 2, and 3 are preset comparison values. The preset comparison values are integers and are related to the ratio between the execution rates of the computing tasks. For example, in the above embodiment, the execution rates of the computing tasks 2, 3, 4, and 5 are equal to each other. A ratio of the execution rate of the computing task 1 to that of each of the computing tasks 2, 3, 4, 5 is 4. The preset comparison value ranges from 0 to 3. Further, if execution rates of N computing tasks are equal to each other, and a ratio of an execution rate of a computing task A to that of each of the N computing tasks is i, the preset comparison value ranges from 0 to (i−1).

In a next application mode, the execution rate of the computing task 1 is reduced to half of an original rate, and the execution rates of the computing tasks 2 to 5 are unchanged. The computing period of the computing task 1 increases and becomes twice an original period of the computing task 1. In an original total computing period, after the computing task 1 is executed, only the computing task 1 and two of the computing tasks 2, 3, 4, and 5 can be executed. In a case of using only the rate controller 8, the program is required to be changed. In the present disclosure, in consideration of that the execution rate of the computing task 1 in the current application mode is changed compared with the execution rate of the computing task 1 in the previous application mode, the jump condition controller 9 directly reads a corresponding value from the data memory 5 as the second condition value (that is, REG_ADJ1=1 in the following) without a condition comparison instruction, and outputs the second condition value to the condition general register. Then, the condition jump is performed. The value in the data memory 5 may be adjusted based on different electrical energy metering bandwidths, the response time and the stabilization time of the digital filter, so that the execution direction of the program can be controlled by hardware.

In the above routine, it is only required to add corresponding jump functions to ends of the computing tasks 2 and 3, to ensure that the computing tasks 4 and 5 can be executed at their original rates. The program for the computing tasks 2 and 3 in this case is rewritten as follows.

TASK2: . . .
  MRD C REG_ADJ1 (Read a value of REG_ADJ1 (that is, a second condition value) into the condition general register as a jump condition)

JMPC TASK4 (Jump to a task 4 for execution if the jump condition is 1)
NOP
TASK3:
...
MRD C REG_ADJ1 (Read the value of REG_ADJ1 (that is, the second condition value) into the condition general register as a jump condition)
JMPC TASK5 (Jump to the task 4 for execution if the jump condition is 1)
NOP In normal execution, since the execution rate of the computing task 1 is reduced to half of the original rate of the computing task 1, RATE1 changes only between 0 and 1. The computing tasks 4 and 5 cannot be executed in the program. In the improved program, when the execution rate of the computing task 1 is reduced by half, the value of REG_ADJ1 becomes 1, that is, the second condition value outputted by the jump condition controller 9 is 1. After the computing task 2 is executed, the program pointer jumps to the computing task 4 for execution. Similarly, the computing task 3 and the computing task 5 may be executed simultaneously. If the execution rate of the computing task 1 is not adjusted, it is only required to change the value of REG_ADJ1 to 0. That is, the second condition value outputted by the jump condition controller 9 is 0. After the computing tasks 2 and 3 are executed, no jump occurs, so that execution of the program cannot be affected. It can be seen that in response to the received jump condition control signal, the jump condition controller 9 is only required to output the second condition value corresponding to the current application mode to the condition general register based on the execution rate of each computing task, so that all computing tasks can be executed.

Therefore, a DSP architecture of the rate controller 8 and the condition jump controller is added, which can provide flexibility for various application scenarios without changing the DSP program.

In addition, the execution rates of the computing tasks in different application modes may be different. In order to prevent data overflow during the computing process and thus resulting in an error in electrical energy metering, in the present disclosure, for the computing tasks with different execution rates, the effective data bit width of data can be adjusted based on the change in the execution rate of the computing task when the data general register reads data from the data memory 5 or writes data back to the data memory 5.

In summary, in actual applications, a user may select a current application mode as needed. The system control register 7 outputs a rate control signal, a jump condition control signal, and a bit width adjustment control signal corresponding to the current application mode. In this device, after the current application mode is determined, the rate controller 8 outputs the execution rate of each computing task to the DSP controller 1, so that the DSP controller 1 compares the execution rate with a corresponding preset comparison value, and outputs the first condition value to the condition general register based on the comparison result, thereby controlling the execution rate of each computing task in the DSP controller 1. The jump condition controller 9 outputs the second condition value corresponding to the current application mode to the condition general register based on a change in the execution rate of each computing task compared with an execution rate of the computing task in a previous application mode, to control the execution flow of the program, so that all computing tasks are executed. In addition, the adaptive word length controller 10 adjusts the effective bit width of the electrical signal read by the data general register from the data memory at execution rates of different computing tasks. It can be seen that a metering bandwidth of the device, the response time and the stabilization time of a digital filter implemented by the device are configurable while ensuring computing accuracy. The device is applicable to various application scenarios and has great flexibility.

Figure 2:
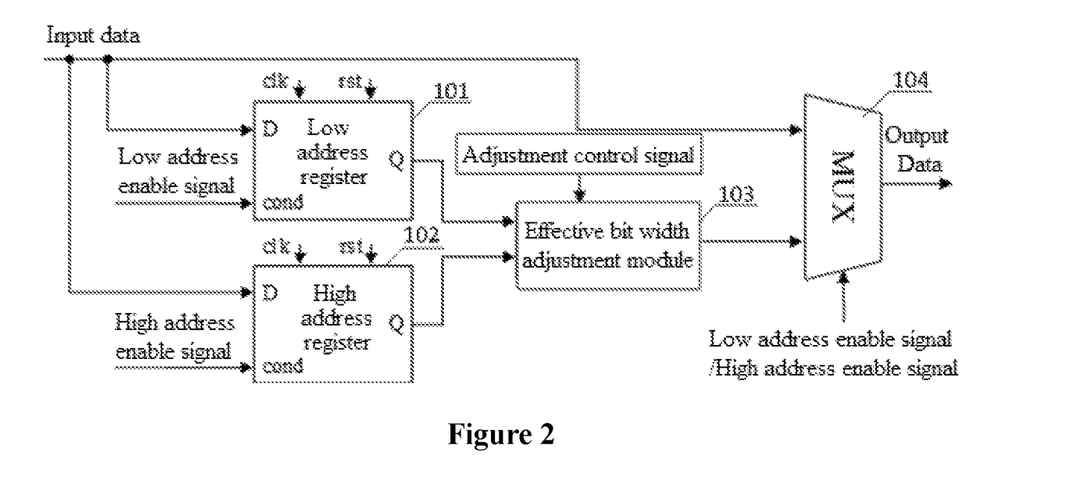
FIG. 2 is a schematic structural diagram of an adaptive word length controller according to the present disclosure.

In a preferred embodiment, the bit width adjustment control signal includes a high address enable signal, a low address enable signal, and an adjustment control signal. The adaptive word length controller 10 includes a high address register 102, a low address register 101, an effective bit width adjustment module 103 and a first data selector 104. The high address register 102 is configured to output the electrical signal read by the data general register from the data memory 5 in a case that the high address enable signal is valid. The low address register 101 is configured to output the electrical signal read by the data general register from the data memory 5 in a case that the low address enable signal is valid. The effective bit width adjustment module 103 is configured to adjust the effective bit width of the electrical signal based on the adjustment control signal. The first data selector 104 is configured to output the electrical signal subjected to the effective bit width adjustment if the high address enable signal or the low address enable signal is valid; otherwise, output the electrical signal read by the data general register from the data memory 5.

In a preferred embodiment, the high address register 102 is a 32-bit high address register, and the low address register 101 is a 32-bit low address register.

As mentioned in the above embodiment, the execution rates of the computing tasks in different application modes may be different. In order to prevent data overflow during the computing process and thus resulting in an error in electrical energy metering, in the present disclosure, an adaptive word length controller 10 is arranged between the data memory 5 and the data general register.

Reference is made to FIG. 2, which is a schematic structural diagram of the adaptive word length controller 10 according to the present disclosure.

The adaptive word length controller 10 determines whether to adjust the effective bit width of the electrical signal read by the data general register from the data memory 5 based on the bit width adjustment control signal outputted by the system control register 7.

In practical applications, an address area in which an effective bit width is required to be adjusted may be first defined. Each piece of data to be adjusted occupies two addresses, namely, a high 32-bit address and a low 32-bit address. Multiple pieces of data having these two addresses can be defined, respectively corresponding to adjustment requirements of different decimal point positions of the digital filter. These addresses may be stored with only two 32-bit real registers.

In a case that the effective bit width of the electrical signal corresponding to the execution rate of each computing task in the current application mode is required to be adjusted, that is, before adjusting the decimal point position, the to-be-adjusted data is required to be sequentially stored in the high address register 102 and the low address register 101. Further, the system control register 7 generates a bit width adjustment control signal based on a current adjustment manner. The bit width adjustment control signal includes a high address enable signal, a low address enable signal, and an adjustment control signal. In this case, the high address enable signal and the low address enable signal are valid. The high address register 102 and the low address register 101 output the electrical signals read by the data general register from the data memory 5. The effective bit width adjustment module 103 adjusts the effective bit width of the data in the low 32-bit register and the high 32-bit register based on the adjustment control signal. Finally, the second data selector outputs the electrical signal subjected to the effective bit width adjustment.

In a case that the effective bit width of the electrical signal corresponding to the execution rate of each computing task in the current application mode is not required to be adjusted, the high address enable signal and the low address enable signal are invalid. The second data selector directly outputs the electrical signal read by the data general register from the data memory 5.

For example, for a second-order CIC filter with a down-sampling rate of 64, a computing bit width to be increased is expressed as:

$$I_a = 2 \times \log_2 64 = 12.$$

In a case that a current computing data has 64 bits, the current computing data is required to be shifted right by 12 bits, to prevent data overflow during the computing process.

It can be seen that by adjusting the effective bit width based on actual needs, the computing accuracy can be ensured, to prevent data overflow during a computing process and thus resulting in an error in electrical energy metering, so that the digital filter implemented by the electrical energy metering device can be configured to have different down-sampling rates, thereby achieving the technical effect that the response time and the stabilization time of the digital filter are configurable.

Figure 3:
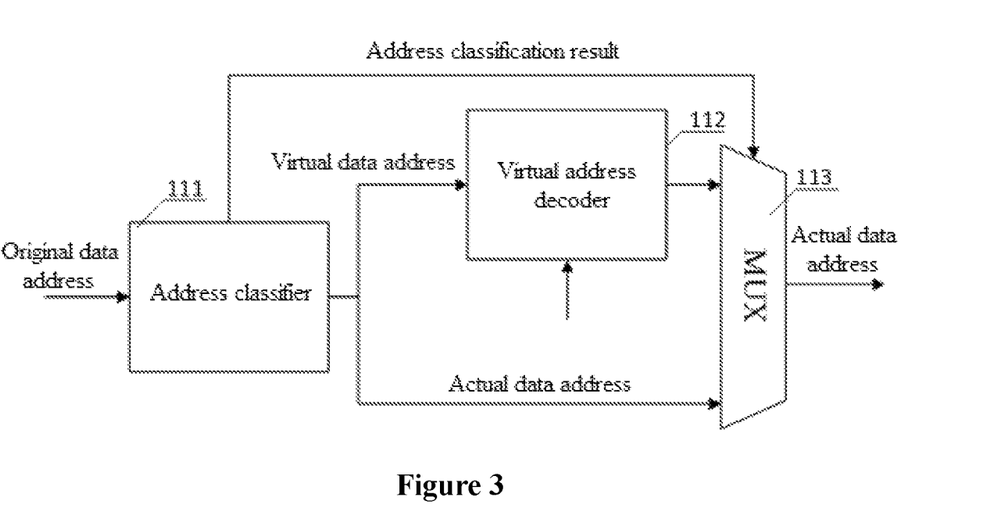
FIG. 3 is a schematic structural diagram of an address decoder according to the present disclosure.

In a preferred embodiment, the DSP-based electrical energy metering device further includes an address decoder 11 arranged between a memory manager and the instruction decoder 6. The address decoder 11 is configured to: classify the address outputted by the instruction decoder 6; if the address is an actual data address, directly output the actual address to the data memory 5; if the address is a virtual data address, map the virtual address to a corresponding actual data address based on a preset virtual actual address mapping relationship, and output the mapped actual data address to the data memory 5. In a case that computing algorithms in different computing steps in one computing task are identical to each other, only one computing algorithm and one virtual data address in the different computing steps are stored in the program memory 4. The virtual address and an actual data address of a to-be-processed electrical signal in the data memory in the different computing steps satisfy the preset virtual actual address mapping relationship.

In a preferred embodiment, the address decoder 11 includes an address classifier 111, a virtual address decoder 112, and a second data selector 113. The address classifier 111 is configured to classify the address outputted by the instruction decoder 6; if the address is an actual data address, directly output the actual address to the data memory 5 via the second data selector 113; and if the address is a virtual data address, output the virtual address to the virtual address decoder 112. The virtual address decoder 112 is configured to map the virtual address to the corresponding actual data address based on the preset virtual actual address mapping relationship, and output the mapped actual data address to the data memory 5 via the second data selector 113.

Reference is made to FIG. 3, which is a schematic structural diagram of the address decoder 11 according to the present disclosure.

For ease of understanding, for example, when the electrical energy metering device operates, there are a first computing step, a second computing step, and a third computing step, an addition algorithm is performed in all of the above three computing steps. In the first computing step, an addition operation is performed on an electrical signal of a first address in the data memory 5. In the second computing step, the addition operation is performed on an electrical signal of a second address in the data memory 5. In the third computing step, the addition operation is performed on an electrical signal of a third address in the data memory 5.

In the conventional technology, in order to achieve the above operations, the addition algorithm and the first address of the to-be-processed electrical signal in the first computing step, the addition algorithm and the second address of the to-be-processed electrical signal in the second computing step, and the addition algorithm and the third address of the to-be-processed electrical signal in the third computing step are stored in the program memory 4. As a result, space occupation of the program memory 4 is increased.

In the present disclosure, in order to solve the above technical problems, it is considered that in some cases, for example, in a case that computing algorithms in different computing steps in one computing task are identical to each other, the program memory 4 may store only one addition algorithm and one virtual data address. The stored virtual data address is in a one-to-many relationship with the actual data addresses of to-be-processed electrical signals in the data memory 5 in different computing steps, and the stored virtual data address and the actual data address satisfy the preset virtual actual address mapping relationship. In addition, if the computing algorithms in different computing steps in one computing task are different from each other, the program memory 4 stores the computing algorithm and the actual data address as in the conventional technology.

In a subsequent usage process, the address classifier 111 classifies the address outputted by the instruction decoder 6. If the address is an actual data address, the actual address is directly outputted to the data memory 5 via the second data selector 113. If the address is a virtual data address, the virtual address is outputted to the virtual address decoder 112, so that the virtual address decoder 112 maps the virtual address to a corresponding actual data address based on the preset virtual actual address mapping relationship, and outputs the mapped actual data address to the data memory 5 via the second data selector 113.

It can be seen that, in this way, the storage space occupation of the program memory 4 can be greatly reduced.

It should be noted that in the present disclosure, terms of "include", "comprise" or any other variants are intended to be non-exclusive. Therefore, a process, method, article or apparatus including a series of elements includes not only the elements but also other elements that are not enumerated, or also includes the elements inherent for the process, method, article or apparatus. Unless expressively limited otherwise, a statement "comprising (including) one . . . " does not exclude the case that other similar elements may exist in the process, method, article or apparatus.

Based on the above description of the disclosed embodiments, those skilled in the art can implement or carry out the present disclosure. It is apparent to those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A digital signal processor (DSP)-based electrical energy metering device, comprising:
   a DSP controller;
   an arithmetic logic unit;
   an instruction decoder;
   a data general register;
   a program memory configured to store a computing program;
   a data memory configured to store an electrical signal;
   a condition general register configured to store a program jump condition value;
   a system control register configured to output a rate control signal, a jump condition control signal and a bit width adjustment control signal corresponding to a current application mode;
   a rate controller configured to determine an execution rate corresponding to each computing task based on the rate control signal;
   a jump condition controller configured to output, in response to the jump condition control signal, a second condition value corresponding to the current application mode to the condition general register based on a change in the execution rate of each computing task compared with an execution rate of the computing task in a previous application mode, to execute all computing tasks; and
   an adaptive word length controller configured to adjust an effective bit width of an electrical signal read by the data general register from the data memory based on the bit width adjustment control signal,
   wherein the DSP controller is configured to compare the execution rate with a corresponding preset comparison value, output a first condition value to the condition general register based on a comparison result, and control the program memory, the instruction decoder, and the arithmetic logic unit based on the first condition value and the second condition value to compute the electrical signal subjected to the effective bit width adjustment, to obtain electrical energy.

2. The DSP-based electrical energy metering device according to claim 1, wherein the current application mode is a high precision mode or a fast response mode.

3. The DSP-based electrical energy metering device according to claim 2, wherein the high address register is a 32-bit high address register, and the low address register is a 32-bit low address register.

4. The DSP-based electrical energy metering device according to claim 3, further comprising:
   an address decoder arranged between a memory manager and the instruction decoder and configured to: classify an address outputted by the instruction decoder; if the address is an actual data address, directly output the actual address to the data memory; if the address is a virtual data address, map the virtual address to a corresponding actual data address based on a preset virtual actual address mapping relationship, and output the mapped actual data address to the data memory, wherein
   in a case that computing algorithms in different computing steps in one computing task are identical to each other, only one computing algorithm and one virtual data address in the different computing steps are stored in the program memory, and the virtual address and an actual data address of a to-be-processed electrical signal in the data memory in the different computing steps satisfy the preset virtual actual address mapping relationship.

5. The DSP-based electrical energy metering device according to claim 2, further comprising:
   an address decoder arranged between a memory manager and the instruction decoder and configured to: classify an address outputted by the instruction decoder; if the address is an actual data address, directly output the actual address to the data memory; if the address is a virtual data address, map the virtual address to a corresponding actual data address based on a preset virtual actual address mapping relationship, and output the mapped actual data address to the data memory, wherein
   in a case that computing algorithms in different computing steps in one computing task are identical to each other, only one computing algorithm and one virtual data address in the different computing steps are stored in the program memory, and the virtual address and an actual data address of a to-be-processed electrical signal in the data memory in the different computing steps satisfy the preset virtual actual address mapping relationship.

6. The DSP-based electrical energy metering device according to claim 1, wherein
   the bit width adjustment control signal comprises a high address enable signal, a low address enable signal, and an adjustment control signal; and
   the adaptive word length controller comprises:
      a high address register configured to output the electrical signal read by the data general register from the data memory in a case that the high address enable signal is valid;
      a low address register configured to output the electrical signal read by the data general register from the data memory in a case that the low address enable signal is valid;
      an effective bit width adjustment module configured to adjust the effective bit width of the electrical signal based on the adjustment control signal; and
      a first data selector configured to output the electrical signal subjected to the effective bit width adjustment if the high address enable signal or the low address enable signal is valid; otherwise, output the electrical signal read by the data general register from the data memory.

7. The DSP-based electrical energy metering device according to claim 6, further comprising:
   an address decoder arranged between a memory manager and the instruction decoder and configured to: classify an address outputted by the instruction decoder; if the address is an actual data address, directly output the actual address to the data memory; if the address is a virtual data address, map the virtual address to a corresponding actual data address based on a preset virtual actual address mapping relationship, and output the mapped actual data address to the data memory, wherein
   in a case that computing algorithms in different computing steps in one computing task are identical to each other, only one computing algorithm and one virtual data address in the different computing steps are stored in the program memory, and the virtual address and an actual data address of a to-be-processed electrical signal in the data memory in the different computing steps satisfy the preset virtual actual address mapping relationship.

8. The DSP-based electrical energy metering device according to claim 1, wherein the data general register comprises a 64-bit first data general register and a 64-bit second data general register.

9. The DSP-based electrical energy metering device according to claim 8, further comprising:

an address decoder arranged between a memory manager and the instruction decoder and configured to: classify an address outputted by the instruction decoder; if the address is an actual data address, directly output the actual address to the data memory; if the address is a virtual data address, map the virtual address to a corresponding actual data address based on a preset virtual actual address mapping relationship, and output the mapped actual data address to the data memory, wherein in a case that computing algorithms in different computing steps in one computing task are identical to each other, only one computing algorithm and one virtual data address in the different computing steps are stored in the program memory, and the virtual address and an actual data address of a to-be-processed electrical signal in the data memory in the different computing steps satisfy the preset virtual actual address mapping relationship.

10. The DSP-based electrical energy metering device according to claim 1, further comprising:

an address decoder arranged between a memory manager and the instruction decoder and configured to: classify an address outputted by the instruction decoder; if the address is an actual data address, directly output the actual address to the data memory; if the address is a virtual data address, map the virtual address to a corresponding actual data address based on a preset virtual actual address mapping relationship, and output the mapped actual data address to the data memory, wherein in a case that computing algorithms in different computing steps in one computing task are identical to each other, only one computing algorithm and one virtual data address in the different computing steps are stored in the program memory, and the virtual address and an actual data address of a to-be-processed electrical signal in the data memory in the different computing steps satisfy the preset virtual actual address mapping relationship.

11. The DSP-based electrical energy metering device according to claim 10, wherein the address decoder comprises an address classifier, a virtual address decoder, and a second data selector, and wherein the address classifier is configured to: classify the address outputted by the instruction decoder; if the address is an actual data address, directly output the actual address to the data memory via the second data selector; and if the address is a virtual data address, output the virtual address to the virtual address decoder; and the virtual address decoder is configured to map the virtual address to a corresponding actual data address based on the preset virtual actual address mapping relationship, and output the mapped actual data address to the data memory via the second data selector.

* * * * *

UNITED STATES PATENT AND TRADEMARK OFFICE
CERTIFICATE OF CORRECTION

| | | |
|---|---|---|
| PATENT NO. | : 11,204,376 B2 | Page 1 of 1 |
| APPLICATION NO. | : 16/843863 | |
| DATED | : December 21, 2021 | |
| INVENTOR(S) | : Wu et al. | |

It is certified that error appears in the above-identified patent and that said Letters Patent is hereby corrected as shown below:

On the Title Page

Item (72) Inventor is corrected to read:
--Boqiang Wu, Hangzhou, (CN);
Nick Nianxiong Tan, Hangzhou, (CN);
Guoyu GUI, Hangzhou, (CN);
Changyou MEN, Hangzhou, (CN)--.

Signed and Sealed this
Fourth Day of October, 2022

Katherine Kelly Vidal
*Director of the United States Patent and Trademark Office*